United States Patent [19]

Schülke

[11] Patent Number: 4,720,407
[45] Date of Patent: Jan. 19, 1988

[54] DOUBLE-WALLED QUARTZ-GLASS TUBE FOR SEMICONDUCTOR-TECHNOLOGY PROCESSES

[75] Inventor: Karl-Albert Schülke, Grosskrotzenburg, Fed. Rep. of Germany

[73] Assignee: Heraeus Quarzschmelze GmbH, Hanau, Fed. Rep. of Germany

[21] Appl. No.: 932,070

[22] Filed: Nov. 18, 1986

[30] Foreign Application Priority Data

Dec. 18, 1985 [DE] Fed. Rep. of Germany ....... 3544812

[51] Int. Cl.$^4$ ........................... F16L 9/14; B01D 9/00
[52] U.S. Cl. ...................................... 428/36; 138/148; 422/245
[58] Field of Search .................. 428/36; 138/141, 148; 65/DIG. 8; 422/245; 156/624

[56] References Cited

U.S. PATENT DOCUMENTS

| | | | |
|---|---|---|---|
| 3,591,340 | 7/1971 | Plaskett | 156/624 |
| 4,399,808 | 8/1983 | Frissora et al. | 126/443 |
| 4,401,487 | 8/1983 | Lockwood | 156/624 |
| 4,582,561 | 4/1986 | Ioku et al. | 156/624 |

Primary Examiner—John E. Kittle
Assistant Examiner—James J. Seidleck
Attorney, Agent, or Firm—Sprung Horn Kramer & Woods

[57] ABSTRACT

A double-walled quartz-glass tube for semiconductor-technology processes. The overall structure comprises an inner tube surrounded by a coaxially positioned outer tube. An annular space is left between them. The ends of the tubes that face in the same direction each have a closure. A processing-gas supply connection is mounted on the inner-tube closure and extends tight through the outer-tube closure. The outer tube is sealed tight at the other end against the outside of the inner tube. The outer tube has connections for supplying and removing a scrubbing gas. The object is to prevent the occurrence of defects due to differences in the extent that the two tubes expand to as the result of the heat generated during processing. The inner tube has a diameter of at least 150 mm. At least one of the closures is essentially flat. The axis of the processing-gas supply connection is in alignment with the axis of the inner tube. At least the section of the processing-gas supply connection that extends between the two closures has an inside diameter that is 20 to 70% as long as the inside diameter of the inner tube. The outer tube is fused gas-tight to both the processing-gas supply connection and the outside of the inner tube.

10 Claims, 2 Drawing Figures

DOUBLE-WALLED QUARTZ-GLASS TUBE FOR SEMICONDUCTOR-TECHNOLOGY PROCESSES

BACKGROUND OF THE INVENTION

The present invention relates to a double-walled quartz-glass tube for semiconductor-technology processes and comprises an inner tube surrounded by a coaxially positioned outer tube with an annular space left between them and with the ends of the tubes that face in the same direction each having a closure, whereby a processing-gas supply connection is mounted on the inner-tube closure and extends tight through the outer-tube closure and whereby the outer tube is sealed tight at the other end against the outside of the inner tube and has connections for supplying and removing a scrubbing gas.

Double-walled quartz-glass tubes of this type are discussed by Paul F. Schmidt in "Furnace Contamination and its Remedies," *Solid State Technology*, June 1983, pp. 147 ff. and by R. Krishnamurthy, B. E. Ramachandran, and K. Kaliyamurthy in "Contamination Control Using HCl Gas; Effects on Silica Glass and Minority Carrier Lifetime," *Solid State Technology*, August 1985, pp. 213 ff.

An extremely pure atmosphere is necessary for precipitating silicon and for melting and doping semiconductor pieces in a processing tube. Contamination, especially with certain metals but also with phosphorus, has to be prevented to the greatest extent possible. Especially critical contaminants are alkalis, the elements of the IIIrd and IVth group of the periodic system in general, copper, and heavy metals. The processing tubes are made out of quartz glass, which is especially satisfactory because of its high purity and corrosion resistance. Of the alkali metals, especially undesirable during the high-temperature processes involved in semiconductor technology is sodium, which is always present to a certain extent. Aluminum ions have a powerful getter effect on metal ions, which accordingly lose their inherent motility and move only at a very low diffusion rate. Thus, building aluminum ions into the outer surface of the quartz-glass processing tubes to obtain MOS's (metal-oxide semiconductors) with good electric properties is known. These layers also block the diffusion of sodium. Increasing the cleanliness of the sources of heat, which are another source of contamination, has also been attempted.

Since constantly increasing demands are being made on the quality of the semiconductor chips produced in these quartz-glass processing tubes, attempts have been made to employ double-walled quartz-glass diffusion tubes, flushing the space between the two tube components with a scrubbing gas during the processing in order to bond and remove the ions that diffuse through the wall of the outer tube.

A considerable rejection rate is typical, however, of the aforesaid known double-walled diffusion tubes. This rejection is due to fractures and cracks and to the breaking off of the supply and removal connections, especially the connections that supply processing gas to the inner tube. These defects derive from differences in the expansion of the inner and outer tubes.

SUMMARY OF THE INVENTION

The object of the present invention is, with the aforesaid state of the art as a point of departure, to create a double-walled quartz-glass tube for semiconductor-technology processes that will lack the aforesaid defects, especially defects due to the stresses in the quartz-glass tubes during heat treatment in the furnace.

This object is attained in accordance with the invention by an improvement wherein the inner tube has a diameter of at least 150 mm, wherein at least one of the closures is essentially flat, wherein the axis of the processing-gas supply connection is in alignment with the axis of the inner tube and at least the section of the processing-gas supply connection that extends between the two closures has an inside diameter that is 20 to 70% as long as the inside diameter of the inner tube, and wherein the outer tube is fused gas-tight to both the processing-gas supply connection and the outside of the inner tube.

Although in one preferred embodiment of the invention it is the closure of the outer tube that is flat, double-walled quartz-glass tubes with both closures essentially flat have proven especially practical.

The design of the double-walled quartz-glass tube in accordance with the invention compensates for longitudinal variations between the inner and outer tubes. These variations result in a displacement of the closures, the centers of which are connected by the processing-gas supply connection. It now becomes possible to fuse the other tube gas-tight to both the inner tube and the outside of the inner tube, leaving a close space for the scrubbing gas between the inner and outer tubes.

To ensure that the closures will be sufficiently resilient, the wall of each can be thinner than the wall of its associated tube. A thickness of approximately 3 mm is adequate for a double-walled quartz-glass tube that has an inner tube with a diameter of 150 mm. When the processing-gas supply connection has a diameter that is 20 to 70% and preferably 35% of the inside diameter of the inner tube, aligning the axis of the processing-gas supply connection with the axis of the inner tube provides enough stability and a central connection between the two closures to compensate for longitudinal expansion. A processing-gas supply connection with such a long diameter also helps to center the inner tube in the outer tube when the system is assembled.

It is preferable for [Claim 4] each flat closure to be a disk fused to either the inner tube or the outer tube, each of which is preferably a cylinder.

To provide satisfactory distribution of the scrubbing gas at the intake end throughout the scrubbing-gas distribution space between the inner and outer tubes, both closures are axially separated, with the distance between them being a multiple of the distance between the facing surfaces of the sides of the tubes. Separating the facing surfaces of the closures by 15 mm has turned out to be practical when the inside diameter of the inner tube is at least 150 mm. To prevent tension peaks at the transition between each closure and its adjacent tube wall, the transitions can be rounded off. The radius of curvature should be approximately 15 mm.

It is preferable for the diameters and wall thicknesses of the inner and outer tubes to be related such that the distance between the facing surfaces of the inner and outer tubes is between 2 and 5 mm. This leaves an adequate annular space for the scrubbing gas. It is preferable for the walls of the inner and outer tubes to be 3 to 8 mm thick. Securing the inner tube to the outer tube in the annular space, especially in the midsection in terms of the axial extent of the tubes, turns out to be practical, especially when the double-walled quartz-glass tube is operated in a horizontal position. This can be done by means of short webs fused to the outside of the inner tube or by means of a series of depressions in the outer tube. This measure also helps to reinforce the tubes in relation to each other. The support can, however, also be attained by filling the annular space with granulated quartz glass.

Preferred embodiments of the invention will now be specified with reference to the attached drawings, wherein

DETAILED DESCRIPTION OF THE PREFERRED EMBODIMENTS

Figure 1:
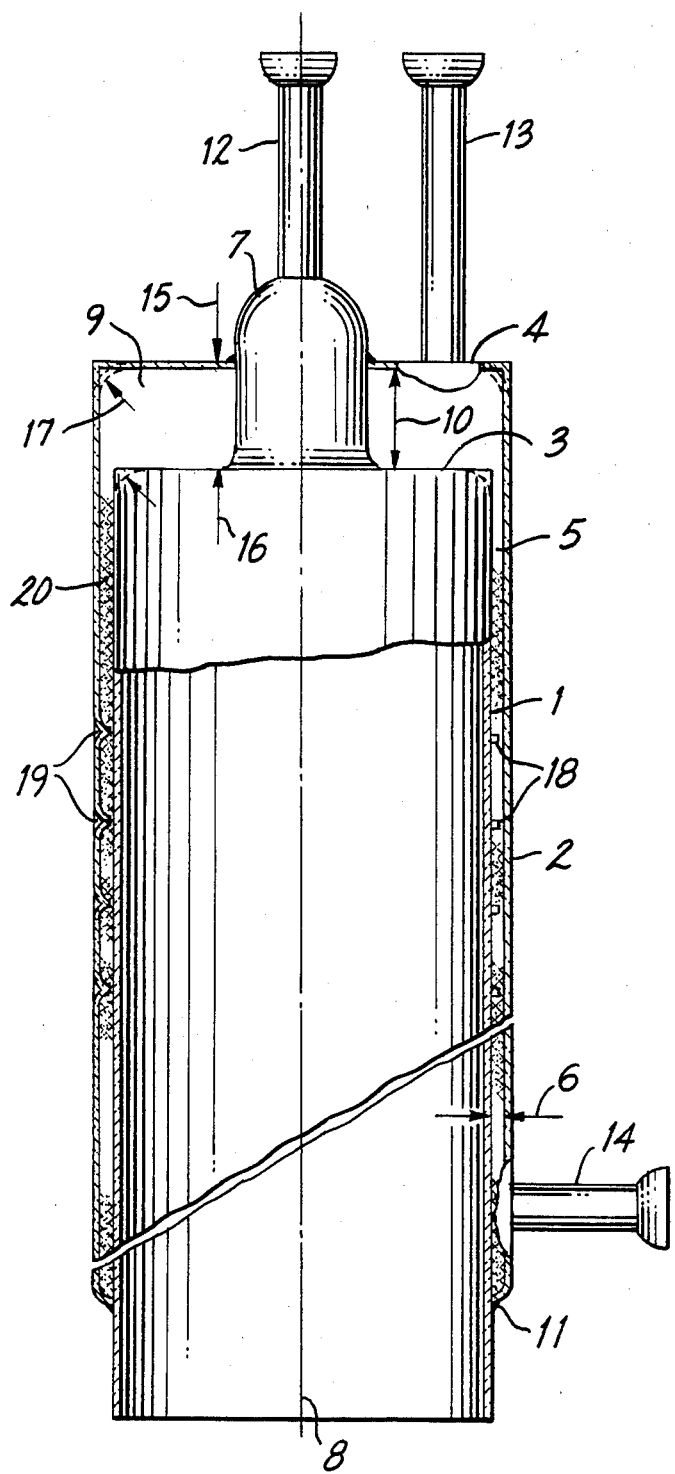
FIG. 1 is a schematic illustration of a double-walled quartz-glass tube according to the invention for semiconductor-technology processes and FIG. 2 is a schematic illustration of another embodiment according to the invention.

Referring now to FIG. 1, a double-walled quartz-glass tube has an inner tube 1 and an outer tube 2, which are in this embodiment elongated cylinders. Inner tube 1 and outer tube 2 are each closed off at one end, the upper end in the drawing, by a closure 3 and 4. The closures are flat plates. The outside diameter of inner tube 1 and the inside diameter of outer tube 2 are related such that an annular space 5 is left between the outer surface of inner tube 1 and the inner surface of outer tube 2. A scrubbing gas flows through annular space 5. The distance, indicated by arrows 6, between the facing surfaces of the walls of the tubes is 5 mm. Fused to the closure 3 of inner tube 1 is a processing-gas supply connection 7. The axis of connection 7 is in alignment with the axis 8 of inner tube 1. The inside diameter of processing-gas supply connection 7 is about 35% of the inside diameter of inner tube 1. Thus, since the inside diameter of the inner tube in the illustrated embodiment is 160 mm, that of the processing-gas supply connection is approximately 56 mm. Closures 3 and 4 are separated, creating a distribution space 9. The distance, indicated by double-head arrow 10, between the closures should be between 10 and 30 mm. Processing-gas supply connection 7, which extends through the closure 4 on outer tube 2 and which centers inner tube 1 inside outer tube 2 at that end, is fused tight to closure 4. At the other end of the double-walled quartz-glass tube, outer tube 2 is fused to the outer surface of inner tube 1, leaving a seam 11 and closing off annular space 5 at that end.

Processing gas is supplied to inner tube 1, inside which the semiconductor chips that are to be processed are placed, through a connection 12 mounted outside outer tube 2 on processing-gas supply connection 7. Scrubbing gas is supplied to distribution space 9 through a connection 13. The scrubbing gas is then distributed to annular space 5 and leaves through an outflow connection 14 at the outer end of outer tube 2.

Since outer tube 2 is subjected to higher temperatures than inner tube 1, it will expand lengthwise to a greater extent. The expansion differential is compensated for by the special design of closures 3 and 4 as flat plates fused to the inner and outer tubes and connected by processing-gas supply connection 7. As the tubes expand, closure 4 will tend to deform into a dome in the direction indicated by arrow 15 and closure 3 will tend to deform into a dome in the opposite direction indicated by arrow 16.

It turns out to be practical to round off the transitions between each closure and its associated tube, preferably with a radius 17 of approximately 15 mm. When the double-walled quartz-glass tube is to be operated in a horizontal position, the annular space 5 between inner tube 1 and outer tube 2 can be provided with short webs 18 fused to the outer surface of inner tube 1 or outer tube 2 can be provided with depressions 19 to reinforce the overall structure. It also turns out to be practical to fill annular space 5 and possibly distribution space 9 as well with granulated quartz glass 20 to reinforce the structure, which can be up to 2 m long, and prevent it from buckling in the horizontal position.

Figure 2:
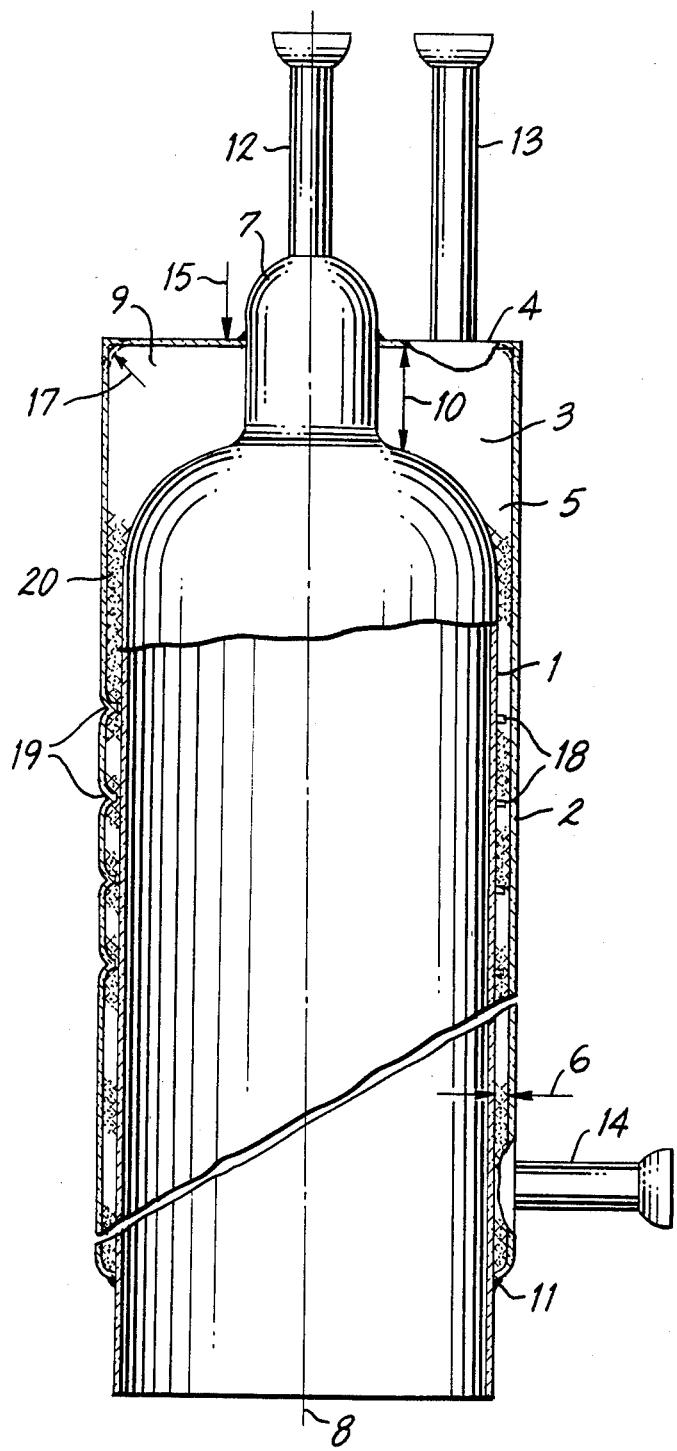

FIG. 2 illustrates another embodiment of the double-walled quartz-glass tube in accordance with the invention. Equivalent components are labeled with the same reference numbers employed in FIG. 1. The structure illustrated in FIG. 2 differs from that illustrated in FIG. 1 in that, whereas the closure 4 of outer tube 2 is again essentially flat, the closure 3 of inner tube 1 is a dome, curving convexly toward closure 4.

It will be appreciated that the instant specification and claims are set forth by way of illustration and not limitation, and that various modifications and changes may be made without departing from the spirit and scope of the present invention.

What is claimed is:

1. In a double-walled quartz-glass tube for semiconductor-technology processes, having an inner tube surrounded by a coaxially positioned outer tube with an annular space between the inner and outer tubes and with the ends of the inner and outer tubes that face in the same direction each having a closure, a processing-gas supply connection mounted on the inner-tube closure and extending through the outer-tube closure and wherein the outer tube is connected at the other end against the outside of the inner tube and has connections for supplying and removing a scrubbing gas, the impovement wherein the inner tube has a diameter of at least 150 mm, wherein at least one of the closures is essentially flat, wherein the axis of the processing-gas supply connection is in alignment with the axis of the inner tube and at least the section of the processing-gas supply connection that extends between the two closures has an inside diameter that is 20 to 70% as long as the inside diameter of the inner tube, and wherein the outer tube is fused gas-tightly to both the processing-gas supply connection and the outside of the inner tube.

2. The double-walled quartz-glass tube according to claim 1, wherein the closure of the outer tube is flat.

3. The double-walled quartz-glass tube according to claim 1, wherein both closures are essentially flat.

4. The double-walled quartz-glass tube according to claim 1, wherein each flat closure comprises a disk fused to either the inner tube or the outer tube.

5. The double-walled quartz-glass tube according to claim 4, wherein the transition between each closure and its adjacent tube wall is rounded off.

6. The double-walled quartz-glass tube according to claim 1, further comprising a scrubbing-gas distribution space between the closure of the inner tube and the closure of the outer tube and having an axial length being a multiple of the distance between the facing surfaces of the sides of the tubes.

7. The double-walled quartz-glass tube according to claim 1, wherein the distance between the facing surfaces of the inner and outer tubes is between 2 and 5 mm.

8. The double-walled quartz-glass tube according to claims 1, wherein the walls of the inner and outer tubes are 3 to 8 mm thick.

9. The double-walled quartz-glass tube according to claim 1, further comprising means securing the inner tube to the outer tube in the annular space.

10. The double-walled quartz-glass tube according to claim 1, further comprising granulated quartz glass filling the annular space.

* * * * *